(12) United States Patent
Watanabe et al.

(10) Patent No.: US 7,648,867 B2
(45) Date of Patent: Jan. 19, 2010

(54) METHOD FOR FABRICATING A SEMICONDUCTOR DEVICE

(75) Inventors: Masataka Watanabe, Yamanashi (JP); Hiroshi Yano, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 85 days.

(21) Appl. No.: 12/027,430

(22) Filed: Feb. 7, 2008

(65) Prior Publication Data

US 2008/0188066 A1     Aug. 7, 2008

(30) Foreign Application Priority Data

Feb. 7, 2007    (JP)    ............................ 2007-028607

(51) Int. Cl.
*H01L 21/338*    (2006.01)
(52) U.S. Cl. .................. 438/183; 438/167; 438/680; 438/712; 257/E21.17; 257/E21.091; 257/E21.218; 257/E21.229
(58) Field of Classification Search .............. 438/183, 438/184, 197, 167, 513, 680, 706, 712, 745, 438/753, 765, 766, 769
See application file for complete search history.

(56) References Cited

U.S. PATENT DOCUMENTS

| | | | | |
|---|---|---|---|---|
| 4,863,879 A | * | 9/1989 | Kwok ........................... | 438/183 |
| 4,963,501 A | * | 10/1990 | Ryan et al. ................... | 438/183 |
| 6,060,755 A | * | 5/2000 | Ma et al. ...................... | 257/410 |
| 6,207,589 B1 | * | 3/2001 | Ma et al. ...................... | 438/785 |
| 6,297,539 B1 | * | 10/2001 | Ma et al. ...................... | 257/410 |

FOREIGN PATENT DOCUMENTS

JP            10-125698 A        5/1998

* cited by examiner

*Primary Examiner*—David Nhu
(74) *Attorney, Agent, or Firm*—Westerman, Hattori, Daniels & Adrian, LLP

(57) ABSTRACT

A method for fabricating a semiconductor device includes: forming a dummy gate that defines a region in which a gate electrode should be formed on a semiconductor substrate; forming a surface film on the semiconductor substrate by directional sputtering vertical to a surface of the semiconductor substrate, the directional sputtering being one of collimate sputtering, long throw sputtering and ion beam sputtering; removing the surface film formed along a sidewall of the dummy gate; removing the dummy gate; and forming the gate electrode in the region from which the dummy gate on the semiconductor substrate has been removed.

9 Claims, 5 Drawing Sheets

METHOD FOR FABRICATING A SEMICONDUCTOR DEVICE

BACKGROUND OF THE INVENTION

1. Field of the Invention

The present invention generally relates to a method for fabricating a semiconductor device, and more particularly, to a method for fabricating a semiconductor device having a gate electrode of a short gate length.

2. Description of the Related Art

MESFETs (Metal Semiconductor Field Effect Transistors) and HEMTs (High Electron Mobility Circuits) are used in MMICs (Microwave Monolithic Integrated Circuits) handling high frequencies and high output powers. MESFETs and HEMTs are Schottky type field effect transistors using compound semiconductors such as GaAs. It is important to reduce the gate length in order to improve high-frequency characteristic of MESFETs and HEMTs.

There are several methods to form the gate electrodes of short gate lengths. For example, Japanese Patent Application Publication No. 10-125698 discloses a method to realize a gate electrode of a short gate length. According to this publication, a dummy gate formed on a semiconductor substrate is narrowed by dry etching with oxygen plasma, and an $SiO_2$ film is subsequently formed on the semiconductor substrate. Then, the dummy gate is removed, and a gate electrode is formed in an area from which the dummy gate has been removed.

SUMMARY OF THE INVENTION

The present invention has been made in view of the above circumstances and provides a method for fabricating a semiconductor device having a gate electrode having a short gate length.

According to an aspect of the present invention, there is provided a method for fabricating a semiconductor device including: forming a dummy gate that defines a region in which a gate electrode should be formed on a semiconductor substrate; forming a surface film on the semiconductor substrate by directional sputtering vertical to a surface of the semiconductor substrate, the directional sputtering being one of collimate sputtering, long throw sputtering and ion beam sputtering; removing the surface film formed along a sidewall of the dummy gate; removing the dummy gate; and forming the gate electrode in the region from which the dummy gate on the semiconductor substrate has been removed.

DESCRIPTION OF THE PREFERRED EMBODIMENTS

A description will now be given of embodiments of the present invention with reference to the accompanying drawings.

First, a description will be given of an experiment conducted by the inventors for the purpose of clarifying a problem about the method for forming the gate electrode disclosed in the above-mentioned application publication.

Figure 1A:
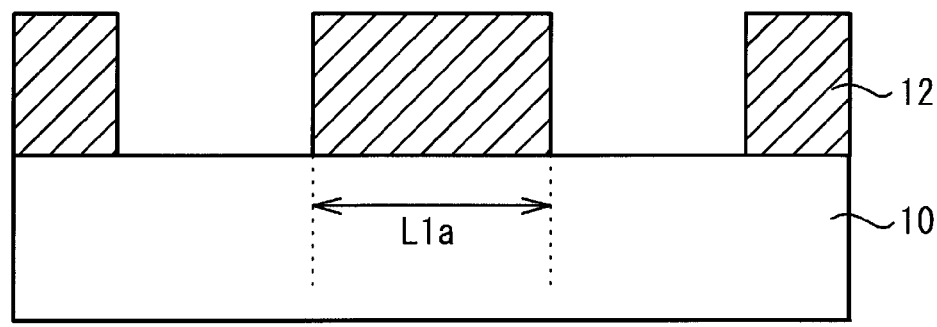
FIGS. 1A through 1C are respectively cross-sectional views of a wafer that show initial steps of a method for fabricating a gate electrode in accordance with a first comparative example.
Figure 1B:
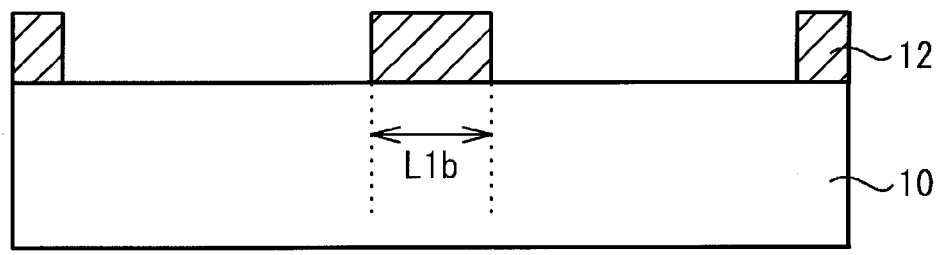
Figure 1C:
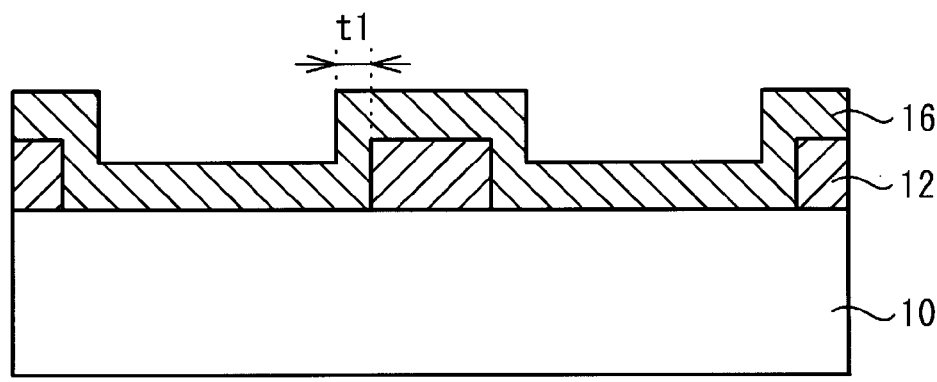

FIGS. 1A through 2C are respectively cross-sectional views of a wafer showing a method for forming a gate electrode of a first comparative example in the experiment. Referring to FIG. 1A, dummy gates 12 are formed on a semiconductor substrate 10 using photoresist. The dummy gates 12 have a width L1a of 0.3 μm and a height of 500 nm. Referring to FIG. 1B, the entire surfaces of the dummy gates 12 are dry-etched by oxygen plasma in order to narrow the dummy gates 12. The resultant dummy gates 12 have a width L1b of 0.1 μm. Referring to FIG. 1C, a surface film 16 made of $SiO_2$ is formed on the semiconductor substrate 10 by sputtering. The surface film 16 is 300 nm thick. Sputtering used in this step may be ordinary sputtering, and the surface film 16 is isotropically formed. Thus, the surface film 16 having a sufficient thickness t1 is formed on the sidewalls of the dummy gates 12.

Figure 2A:
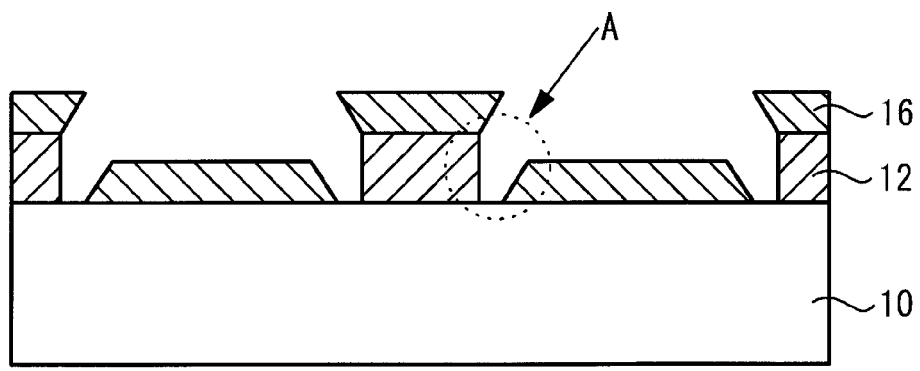
FIGS. 2A through 2C are respectively cross-sectional views of the wafer that show subsequent steps that follow the steps shown in FIGS. 1A through 1C.
Figure 2B:
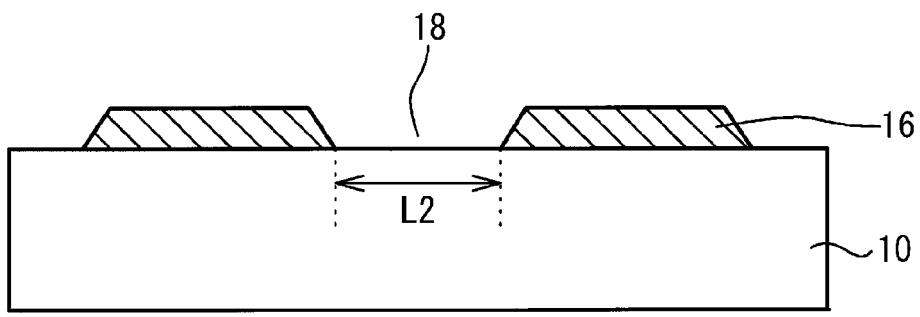
Figure 2C:
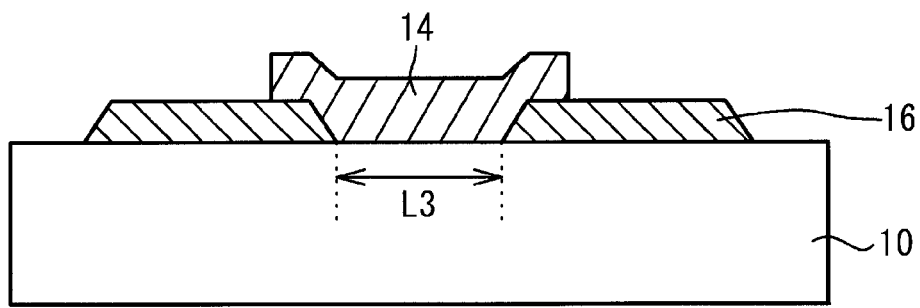

Referring to FIG. 2A, the surface film 16 formed on the sidewalls of the dummy gates 12 is removed by wet etching with buffered hydrofluoric acid. The time for wet etching may be one minute. The surface film 16 formed along the sidewalls of the dummy gates 12 is weak and is liable to be wet-etched. Thus, etching of the surface film 16 formed in boundary regions A between the sidewalls of the dummy gates 12 and the surface of the semiconductor substrate 10 progresses, so that the surface film 16 on the semiconductor substrate 10 is removed within a range of 0.05 μm from the dummy gates 12. Referring to FIG. 2B, the dummy gates 12 are removed by liftoff. This removal of the dummy gates 12 results in openings 18, which may have a width L2 of 0.2 μm. Referring to FIG. 2C, gate electrodes 14 are formed in the openings 18. The gate electrodes 14 may have a gate length L3 of 0.2 μm. Through the above process, the gate electrodes of the first comparative example are completed.

According to the fabrication method of the first comparative example, as shown in FIG. 2C, the gate lengths L3 of the gate electrodes 14 are 0.2 μm, and are 0.1 μm greater than the widths L1b of the dummy gates 12 equal to 0.1 μm. As described above, the fabrication method of the first comparative example has a problem that the gate lengths L3 are not defined by the widths L1b of the dummy gates 12 and are greater than the widths L1b of the dummy gates 12.

A description will now be given of embodiments of the present invention capable of solving the above problem.

Figure 3A:
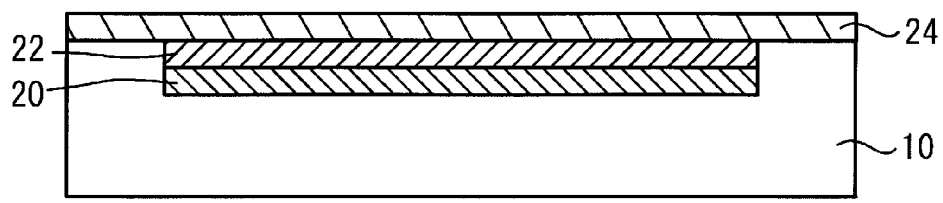
FIGS. 3A through 3C are respectively cross-sectional views of a wafer that show initial steps of a method for fabricating a MESFET in accordance with a first embodiment.
Figure 3B:
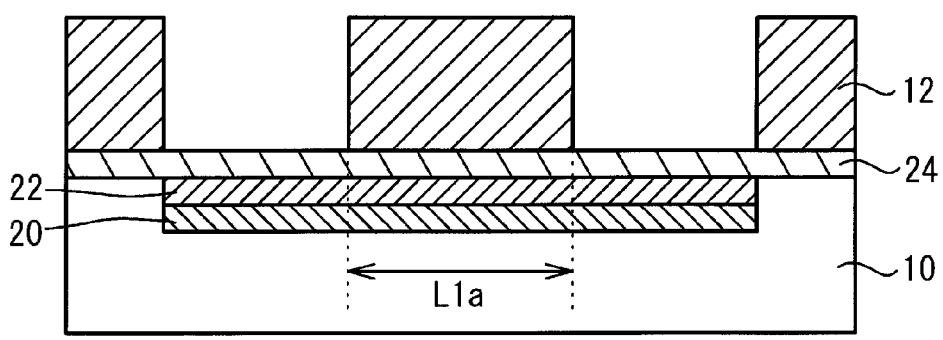
Figure 3C:
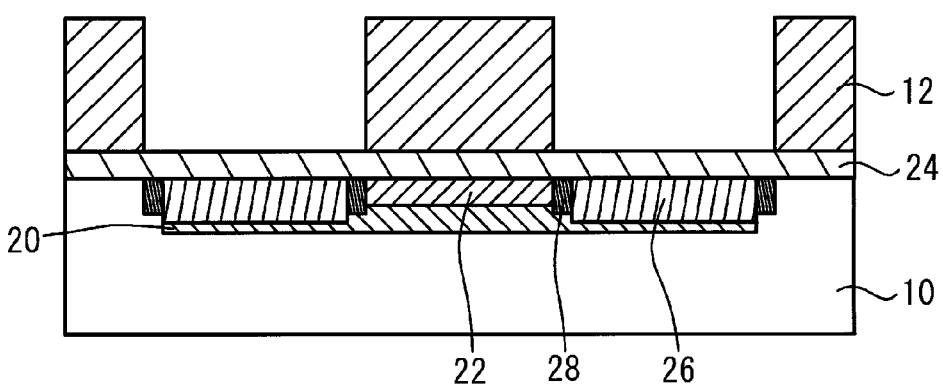

FIGS. 3A through 5C show methods for fabricating a MESFET in accordance with a first embodiment. The following description focuses on only one MESFET for the sake of simplicity. Referring to FIG. 3A, a p-type region 20 is formed in the semiconductor substrate 10, which may be a GaAs substrate, by ion implantation of Mg, and an n-type active layer 22 is formed by ion implantation of $Si^+$. An SiN layer 24 is formed on the semiconductor substrate 10 by ECR plasma CVD (Electron Cyclotron Resonance Plasma Chemical Vapor Deposition). Referring to FIG. 3B, the dummy gate 12 for defining the region for forming the gate electrode 14 is formed in a surface region of the SiN layer 24 on the semiconductor substrate 10 in which the gate electrode 14 should be formed by photoresist using an i-ray stepper. The width L1a of the dummy gate 12 may be 0.3 μm, and a height may be 500 nm. Referring to FIG. 3C, the semiconductor substrate 10 is doped with $Si^+$ by self-alignment ion implantation with the dummy gate 12 being used as a mask. This doping results in $n^+$-type regions 26 having a doping concentration higher than that of the n-type active layer 22 in the semiconductor substrate 10. Then, the entire surface of the dummy gate 12 is dry-etched by oxygen plasma in order to decrease the width L1a of the dummy gate 12. Thereafter, the semiconductor substrate 10 is doped with $Si^+$ again with the narrowed dummy gate 12 being used as a mask, so that $n^-$-type regions 28 can be formed. The $n^-$-type regions 28 thus formed have a doping concentration that is higher than that of the n-type active layer 22 and is lower than that of the $n^+$-type regions 26.

Figure 4A:
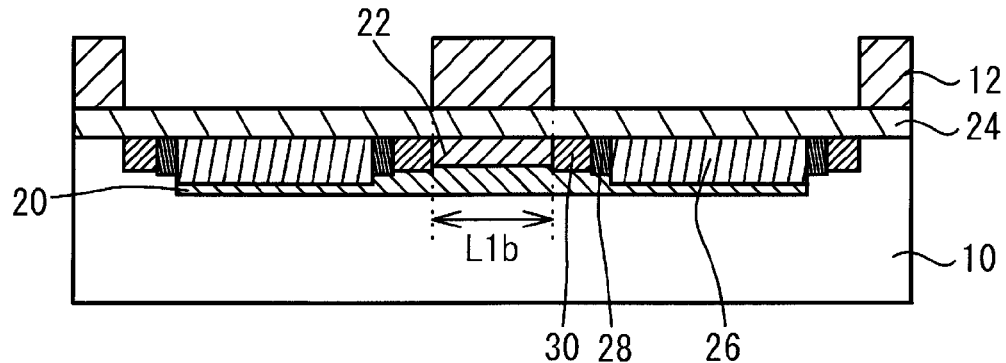
FIGS. 4A through 4C are respectively cross-sectional views of the wafer that show steps that follow the steps shown in FIGS. 3A through 3C.
Figure 4B:
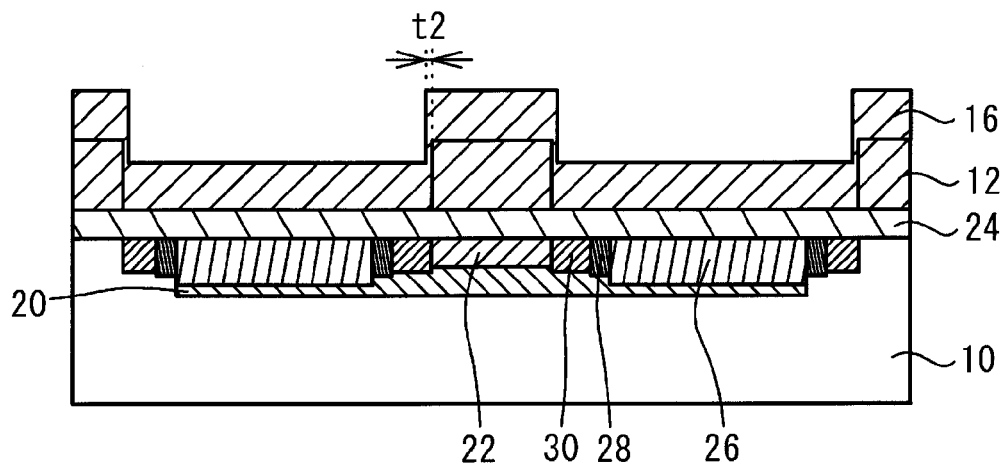

Referring to FIG. 4A, the entire surface of the dummy gate 12 is dry-etched by oxygen plasma again, so that the dummy gate 12 can be narrowed. The width L1b of the narrowed dummy gate 12 may be 0.1 μm. Then, the semiconductor substrate 10 is doped with, for example, $Si^+$ by self-alignment ion implantation with the dummy gate 12 being used as a mask, so that an $n^{--}$-type region 30 can be formed in the semiconductor substrate 10. The $n^{--}$-type region 30 has a doping concentration higher than that of the n-type active layer 22 and lower than that of the $n^-$-type regions 28. The n-type active layer 22, the $n^{--}$-type region 30, and the $n^-$-type regions 28 and the $n^+$-type region 26 form an impurity region in which the doping concentration increases stepwise in that order. The impurity region thus formed prevents the electric field strength from locally concentrating and improves the breakdown when a voltage is applied to the $n^+$-type regions 26. Referring to FIG. 4B, the surface film 16 of $SiO_2$ is formed on the semiconductor substrate 10 by collimate sputtering. The surface film 16 may be 300 nm thick. The collimate sputtering used in the step of FIG. 4B is a method for fixing the semiconductor substrate 10 so as to align the direction vertical to the surface of the semiconductor substrate 10 and the direction vertical to the surface of the $SiO_2$ target in the sputtering apparatus with each other. The collimate sputtering realizes directional sputtering in which sputtering mainly progresses in the direction vertical to the surface of the semiconductor substrate 10. The collimate sputtering makes it possible to extremely reduce the thickness t2 of the surface film 16 along the sidewall of the dummy gate 12.

Figure 4C:
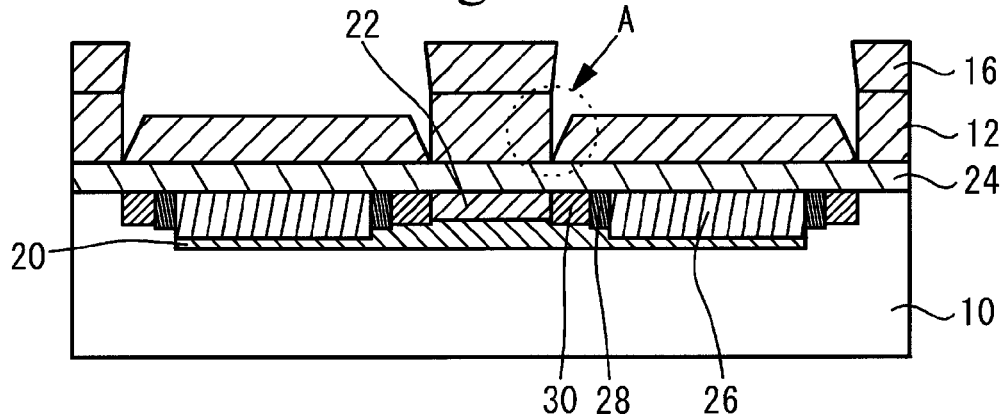

Referring to FIG. 4C, the surface film 16 formed along the sidewall of the dummy gate 12 is removed by wet etching with buffered hydrofluoric acid. The surface film 16 formed along the sidewall of the dummy gate 12 is weak and is thus liable to be wet-etched. In contrast, the surface film 16 on the surface of the semiconductor substrate 10 is hard and has difficulty in wet etching. It is thus possible to selectively etch the surface film 16 along the sidewall of the dummy gate 12. Further, the surface film 16 formed along the sidewall of the dummy gate 12 is very thin, and therefore, it takes only 10 seconds to etch it with buffered hydrofluoric acid. These factors make it very difficult for wet etching of the surface film 16 to progress in the boundary region A between the sidewall of the dummy gate 12 and the surface of the semiconductor substrate 10. Thus, the surface film 16 remains without being removed.

Figure 5A:
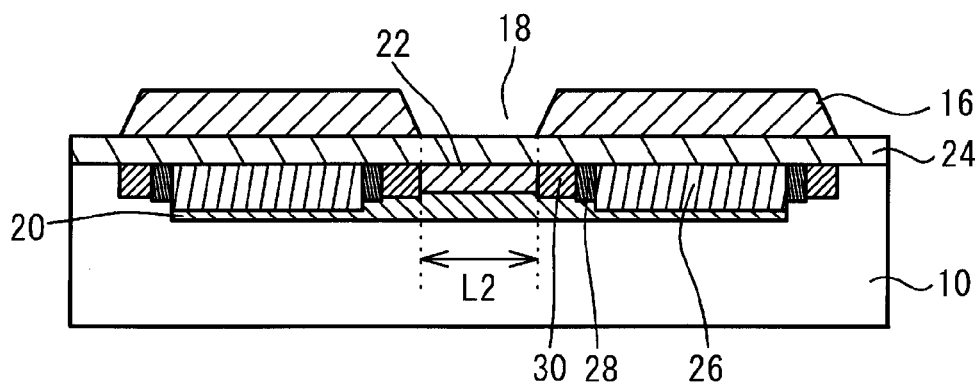
FIGS. 5A through 5C are respectively cross-sectional views of the wafer that show steps subsequent to the steps shown in FIGS. 4A through 4C.
Figure 5B:
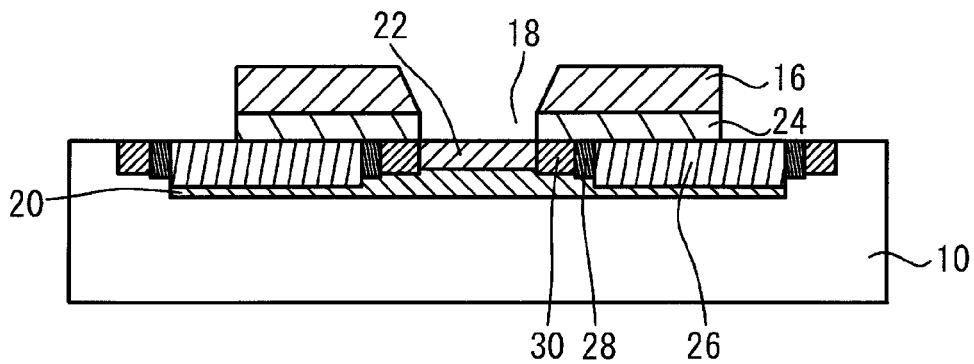
Figure 5C:
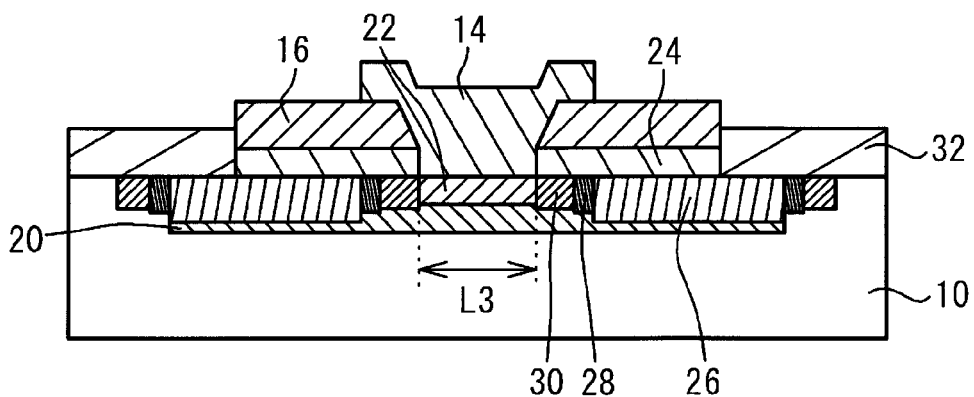

Referring to FIG. 5A, the dummy gate 12 is removed along with the surface film 16 located thereon by liftoff. This removal results in an opening 18, which may have a width L2 of 0.1 μm. Referring to FIG. 5B, the surface film 16 on the $n^+$-type regions 26 is etched by a mask of photoresist formed into a predetermined pattern. After that, the SiN layer 24 in the opening 18 and the $n^+$-type regions 26 from which the surface film 16 has been removed by etching is etched by a mask of photoresist formed into a predetermined pattern. Referring to FIG. 5C, the gate electrode 14 is formed on the semiconductor substrate 10 in the opening 18 by evaporating, for example, Ti (titanium)/Pt (platinum)/Au (gold) in this order from the semiconductor substrate 10, and performing liftoff. The gate length L3 of the gate electrode 14 may be 0.1 μm. Then, an ohmic electrode 32 is formed by evaporating AuGe/Ni/Au on the $n^+$-type regions 26 in this order from the semiconductor substrate 10. Through the above process, the MESFET of the first embodiment is completed.

According to the first embodiment, as shown in FIG. 4B, the surface film 16 is formed by the collimate sputtering that is directional sputtering in the direction vertical to the surface of the semiconductor substrate 10. Generally, collimate sputtering enables deposition on an object in the direction vertical to the surface of the object, and is thus used as a deposition method for an opening having a high aspect ratio. For example, collimate sputtering is used to fill a through hole connecting upper and lower interconnection lines in a multiplayer interconnection structure with a metal. However, the present invention is not interested in the vertical directionality of deposition by collimate sputtering. The present invention pays attention to a comparatively small amount of deposition along the sidewall of the dummy gate 12 realized by collimate sputtering and uses collimate sputtering to form the surface film 16. The sidewall of the dummy gate 12 is not a region enclosed by a wall such as an through hole vertically connecting interconnection layers, but is a very open region because the $n^+$-type regions 26 respectively serving as a drain region and a source region are located at opposite sides of the dummy gate 12. That is, according to an aspect of the present invention, collimate sputtering is employed for a specific application that is quite different from deposition for a narrow opening. In general collimate sputtering, deposition is performed with a collimator that is made of stainless or tungsten and is provided in front of the object subjected to deposition. Thus, there are problems that the collimator reduces the amount of deposition and degrades the deposition rate. In view of the above considerations, the present invention intentionally uses collimate sputtering in a specific manner quite different from the conventional manner although collimate sputtering has the above-mentioned problems about the amount of deposition and the deposition rate. Collimate sputtering performed in the direction vertical to the surface of the semiconductor substrate 10 makes it possible to realize a much less thickness t2 of the surface film 16 formed along the sidewall of the dummy gate 12 than the thickness of the first comparative example. Thus, it takes only 10 seconds for the first embodiment to remove the surface film 16 formed along the sidewall of the dummy gate 12 by wet etching with buffered hydrofluoric acid, whereas it takes one minute in the first comparative example.

As described above, the first embodiment is capable or shortening the time for wet etching with buffered hydrofluoric acid, as compared to the first comparative example. Thus, as shown in FIG. 4C, wet etching of the surface film 16 formed on the semiconductor substrate 10 in the boundary region A hardly progresses, so that the surface film 16 cannot be removed. Thus, the first embodiment does not have the aforementioned adverse phenomenon in which the surface film 16 formed on the surface of the semiconductor substrate 10 is removed within a range of 0.05 μm from the dummy gate 12 as in the case of the first comparative example. Thus, as shown in FIG. 5A, the width L2 of the opening 18 defined by removal of the dummy gate 12 can be set to 0.1 μm equal to the width L1b of the dummy gate 12. Thus, as shown in FIG. 5C, the gate length L3 of the gate electrode 14 formed in the opening 18 can be set equal to 0.1 μm as long as the width L1b of the dummy gate 12. As described above, the first embodiment is capable of defining the gate length L3 by the width L1b of the dummy gate 12 and producing the gate electrode 14 having a shorter gate length than the gate length of the first comparative example.

According to the first embodiment, as shown in FIG. 4A, the dummy gate 12 is formed by photoresist, and the entire surface thereof is dry-etched by oxygen plasma, so that the width of the dummy gate 12 can be reduced. It is thus possible to realize a less width of the dummy gate 12 than the minimum width of the dummy gate 12 formable by the photo process. For example, the dummy gate 12 formed by the i-ray stepper has a minimum width of 0.3 μm. When the entire surface of the dummy gate 12 is dry-etched by oxygen plasma, the dummy gate 12 can be narrowed to a thickness less than 0.3 μm, for example, 0.1 μm. It is thus possible to realize a gate width less than the gate length L3 defined by the width L1b of the dummy gate 12.

According to the first embodiment, the surface film 16 is formed by collimate sputtering. Another directional sputtering such as long throw sputtering or ion beam sputtering may be used to form the surface film 16. The directional sputtering is capable of realizing a very small thickness t2 of the surface film 16 formed along the sidewall of the dummy gate 12 and producing the gate electrode 14 having a shortened gate length. In general collimate sputtering, the collimator is placed in front of the semiconductor substrate 10 (that is, arranged between the semiconductor substrate 10 and a sputter source) and allows only sputtered particles located in the direction vertical to the surface of the semiconductor substrate 10 or directions close thereto to pass through the collimator. In long throw sputtering, the distance between the semiconductor substrate 10 and the target is increased, so that only sputtered particles located in the direction vertical to the surface of the semiconductor substrate 10 or directions close thereto can reach the semiconductor substrate 10. In ion beam sputtering, an ion source is provided outside of a chamber. Thus, there is no need to generate plasma within the chamber and high vacuum (as high as $2.0 \times 10^{-5}$ torr) can be realized. Thus, sputtering can be carried out in comparatively high vacuum, and scattering of sputtered particles can be restrained. Thus, the sputtered particles can hit the semiconductor substrate 10 vertically.

As has been described previously, collimate sputtering realizes a comparatively small amount of deposition due to the collimator. This degrades the deposition rate. A similar problem occurs in long throw sputtering because the distance between the semiconductor substrate 10 and the target (sputter source) is comparatively long (which may be 10 cm or longer). Ion beam sputtering realizes only a deposition rate equal to 1/10 of the conventional sputtering. For these reasons, conventionally, sputtering having a high deposition rate such as plasma sputtering is generally used to form the surface film 16. In other words, the conventional art does not have any concept of using low deposition rate sputtering such as collimate sputtering, long throw sputtering or ion beam sputtering in order to form the surface film 16.

The first embodiment is not limited to wet etching with buffered hydrofluoric acid for removing the surface film 16 formed along the sidewall of the dummy gate 12 but may employ another process such as wet etching with hydrofluoric acid. Preferably, wet etching is used because the surface film 16 formed along the sidewall of the dummy gate 12 can be selectively removed.

The surface film 16 is not limited to $SiO_2$ but may be made of another material that can be formed by directional sputtering, such as Si, SiN or SiON. Preferably, such material can be removed by wet etching. The dummy gate 12 may be formed by another process that does not use photoresist.

The process of the first embodiment may fabricate not only MESFET but also HEMT.

The present invention is not limited to the specifically disclosed embodiments, but may include other embodiments and variations without departing from the scope of the present invention.

The present application is based on Japanese Patent Application No. 2007-028607 filed on Feb. 7, 2007, the entire disclosure of which is hereby incorporated by reference.

What is claimed is:

1. A method for fabricating a semiconductor device comprising:

forming a dummy gate that defines a region in which a gate electrode is formed on a semiconductor substrate;

forming a surface film on the semiconductor substrate so as to cover an upper surface and a sidewall of the dummy gate by directional sputtering vertical to a surface of the semiconductor substrate, the directional sputtering being one of collimate sputtering, long throw sputtering and ion beam sputtering, a thickness in a perpendicular direction to the sidewall of the dummy gate of the surface film formed on the sidewall of the dummy gate being smaller than a thickness in a perpendicular direction to the surface of the semiconductor substrate of the surface film formed on the semiconductor substrate located on both sides of the dummy gate and the upper surface of the dummy gate, removing the surface film formed along the sidewall of the dummy gate so as to form an opening that exposes the sidewall of the dummy gate;

removing the dummy gate and the surface film formed on the upper surface of the dummy gate by etching the dummy gate through the opening; and forming the gate electrode in a region from which the dummy gate on the semiconductor substrate has been removed.

2. The method for fabricating a semiconductor device as claimed in claim 1, wherein removing the surface film is performed by wet etching.

3. The method for fabricating a semiconductor device as claimed in claim 1, wherein the dummy gate is formed by photoresist.

4. The method for fabricating a semiconductor device as claimed in claim 1, further comprising dry etching an entire surface of the dummy gate so that the dummy gate has a reduced width.

5. The method for fabricating a semiconductor device as claimed in claim 1, wherein the surface film is made of one of Si, $SiO_2$, SiN and SiON.

6. The method for fabricating a semiconductor device as claimed in claim 1, wherein the semiconductor device is one of a MESFET and a HEMT.

7. The method for fabricating a semiconductor device as claimed in claim 1, wherein the directional sputtering is collimate sputtering and includes arranging a collimator between the semiconductor substrate and a sputter source.

8. The method for fabricating a semiconductor device as claimed in claim 1, wherein the directional sputtering is long throw sputtering and includes arranging the semiconductor substrate and a sputter source at an interval equal to or greater than 10 cm.

9. The method for fabricating a semiconductor device as claimed in claim 1, wherein the directional sputtering is ion beam sputtering and includes arranging an ion source outside of a chamber for sputtering.

* * * * *